United States Patent
Lee

(10) Patent No.: US 8,223,506 B2
(45) Date of Patent: Jul. 17, 2012

(54) POWER SEMICONDUCTOR MODULE

(75) Inventor: Byong Ho Lee, Cheonan-si (KR)

(73) Assignee: LS Industrial Systems Co., Ltd., Anyang-si (KR)

( * ) Notice: Subject to any disclaimer, the term of this patent is extended or adjusted under 35 U.S.C. 154(b) by 319 days.

(21) Appl. No.: 12/611,072

(22) Filed: Nov. 2, 2009

(65) Prior Publication Data

US 2010/0134994 A1 Jun. 3, 2010

(30) Foreign Application Priority Data

Dec. 3, 2008 (KR) .................. 10-2008-0122080

(51) Int. Cl.
*H01R 9/00* (2006.01)

(52) U.S. Cl. ..................... 361/775; 361/760

(58) Field of Classification Search .......... 361/699, 361/760, 775; 174/260, 262; 257/732, 675, 257/706, 707
See application file for complete search history.

(56) References Cited

U.S. PATENT DOCUMENTS

| 6,191,367 | B1 * | 2/2001 | Hayashi | 174/260 |
| 7,545,033 | B2 * | 6/2009 | Grant | 257/706 |
| 7,723,846 | B2 * | 5/2010 | Ikawa et al. | 257/732 |
| 2003/0168252 | A1 | 9/2003 | Schmid et al. | |
| 2006/0082983 | A1 * | 4/2006 | Parkhill et al. | 361/775 |
| 2007/0194443 | A1 | 8/2007 | Lederer et al. | |
| 2007/0205038 | A1 * | 9/2007 | Tominaga et al. | 180/444 |
| 2008/0048342 | A1 * | 2/2008 | Cheah et al. | 257/777 |
| 2009/0231810 | A1 * | 9/2009 | Liang et al. | 361/699 |

FOREIGN PATENT DOCUMENTS

| DE | 10345768 | 5/2005 |
| JP | 08007956 | 1/1996 |
| JP | 11177017 | 7/1999 |
| JP | 2006303375 | 11/2006 |
| JP | 2008294275 | 12/2008 |

\* cited by examiner

*Primary Examiner* — Yuriy Semenenko

(74) *Attorney, Agent, or Firm* — Lee, Hong, Degerman, Kang & Waimey

(57) ABSTRACT

A power semiconductor module is disclosed, comprising: a substrate mounted with a power semiconductor device and formed with a pattern; and an integrated terminal unit integrally assembled with a power terminal for applying power to the substrate and a body in which a signal terminal for inputting a signal to or outputting the signal from the substrate is made of an insulated resin material, wherein the integrated terminal unit can be mounted to the substrate to allow the power terminal and the signal terminal to be simultaneously connected to the substrate.

7 Claims, 2 Drawing Sheets

【FIG. 1】
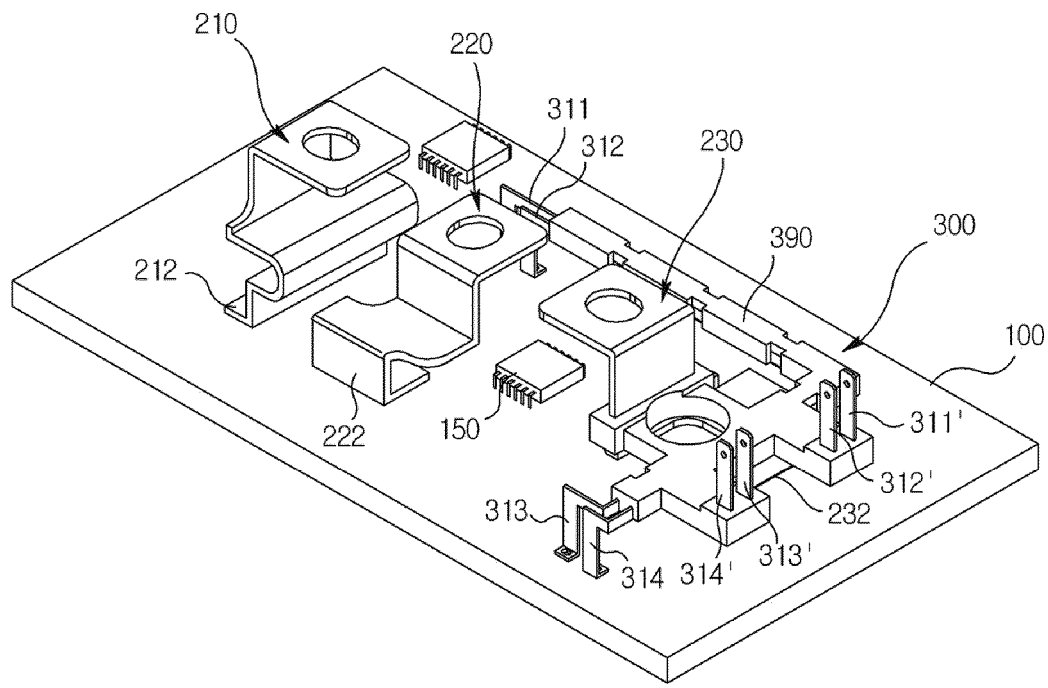
【FIG. 2】
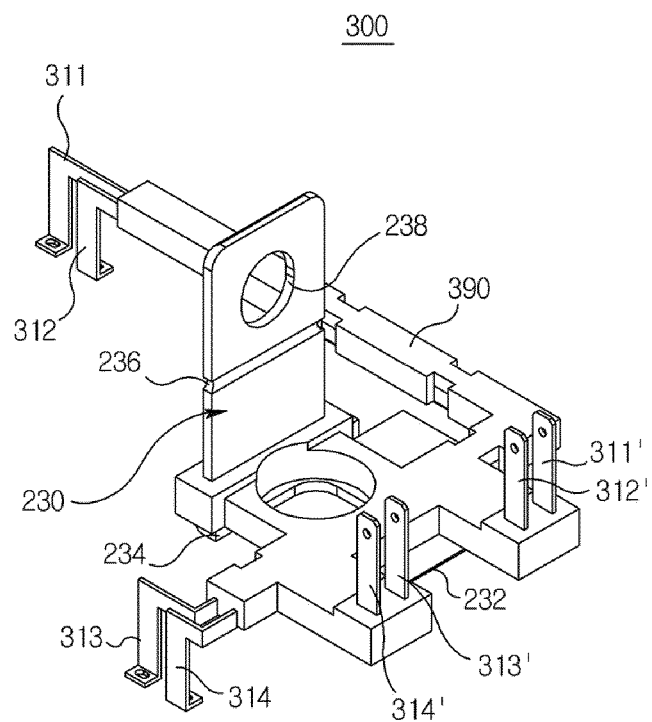

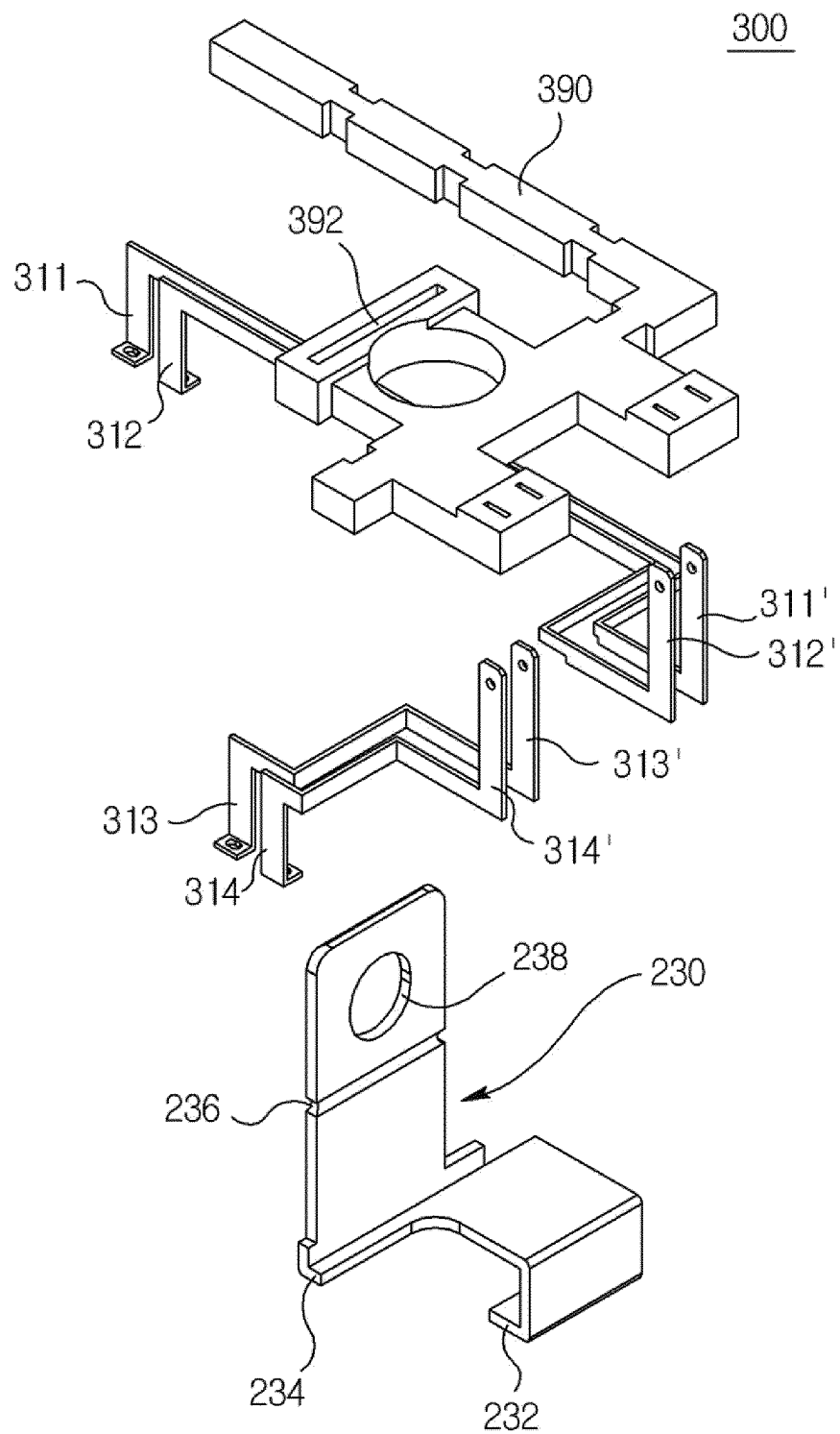
[FIG. 3]

POWER SEMICONDUCTOR MODULE

CROSS-REFERENCE TO RELATED APPLICATION

The present application is based on, and claims priority from, Korean Application Numbers 10-2008-0122080, filed Dec. 3, 2008, the disclosure of which is incorporated by reference herein in its entirety.

BACKGROUND

The present disclosure relates to a power semiconductor module which has integrated a power terminal for supplying electric power and a signal terminal for inputting and outputting a signal, the module of which is mountable on a substrate.

Power semiconductor modules are well known and are widely used on inverters, converters and UPSs (Uninterruptible Power Systems). The power semiconductor modules are applicable for a motor control, a switch, a power supply and the like.

A power semiconductor module typically comprised of an IGBT (Insulated Gate Bipolar Transistor), a power MOSFET (Metal Oxide Semiconductor Field Effect transistor) or a bipolar transistor is commonly formed by employing a transistor element and a diode device, both of which are wire-bonded on a DBC (Direct Bonded Copper) substrate, and a power terminal and a signal terminal extended to the outside, both of which are bonded to the DBC substrate.

Conventionally, the power terminal and signal terminal, which are separate components, constitute a wire connection structure where the power terminal and the signal terminal are separately wire-bonded to the DBC substrate.

However, the conventional power semiconductor module has the following disadvantages in that the wire connection structure complicates a DBC structure, increases the number of assembly processes, decreases a manufacturing yield and thereby becomes a potential cause of generating defects.

SUMMARY

The present invention provides a power semiconductor module capable of providing an integrated terminal unit in which a power terminal and a signal terminal are integrated, instead of providing and assembling the power terminal and the signal terminal in a separate element, whereby the integrated terminal unit can be mounted on a DBC substrate at a time to greatly reduce the number of assembly processes but increase the productivity.

According to a general aspect of the present disclosure, there is provided a power semiconductor module comprising: a substrate mounted with a power semiconductor device and formed with a pattern; and an integrated terminal unit formed with a body which is integrally assembled with a power terminal and a signal terminal, the body being made of an insulated resin material, wherein the power terminal applies power to the substrate and the signal terminal inputs a signal to or outputs the signal from the substrate, and wherein the integrated terminal unit can be mounted to the substrate to allow the power terminal and the signal terminal to be simultaneously connected to the substrate.

According to another general aspect of the present disclosure, there is provided a power semiconductor module comprising: a substrate mounted with a power semiconductor device and formed with a pattern; and an integrated terminal unit including a body integrally assembled with a plurality of power terminals for applying power to the substrate and a plurality of signal terminals for applying a signal to or outputting the signal from the substrate, the body being made of an insulated resin material, wherein an electrical connection between the plurality of power terminals and the substrate and an electrical connection between the plurality of signal terminals and the substrate can be simultaneously executed.

According to still another general aspect of the present disclosure, there is provided a power semiconductor module comprising: a substrate mounted with a power semiconductor device and formed with a pattern; and an integrated terminal unit including a body integrally assembled with a plurality of power terminals for applying power to the substrate and a plurality of signal terminals for applying a signal to or outputting the signal from the substrate, the body being made of an insulated resin material, wherein the power terminals, the signal terminals and the substrate are discrete by the body, such that the power terminals, the signal terminals and the substrate are electrically isolated.

BRIEF DESCRIPTION OF DRAWINGS

FIG. 1 is a perspective view illustrating structure of a power semiconductor module according to the present disclosure.

FIG. 2 is a perspective view illustrating structure of an integrated terminal unit according to the present disclosure.

FIG. 3 is an assembled perspective view of FIG. 2.

DETAILED DESCRIPTION

An exemplary embodiment of the present disclosure will be described in detail with reference to the accompanying drawings.

In the drawings, the shapes and relative sizes of constituent elements may be exaggerated for clarity and convenience of explanation. Like numbers refer to like elements throughout. In describing the present disclosure, detailed descriptions of constructions or processes known in the art may be omitted to avoid obscuring appreciation of the invention by a person of ordinary skill in the art with unnecessary detail regarding such known constructions and functions.

Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification. As used herein, the singular forms "a", "an" and "the" are intended to include the plural forms as well, unless the context clearly indicates otherwise.

FIG. 1 is a perspective view illustrating structure of a power semiconductor module according to the present disclosure, FIG. 2 is a perspective view illustrating structure of an integrated terminal unit according to the present disclosure, and FIG. 3 is an assembled perspective view of FIG. 2.

Now, referring to FIGS. 1 to 3, the construction and operation of the power semiconductor module according to the present disclosure will be described in detail.

A power semiconductor module according to the present disclosure may include a substrate 100 and an integrated terminal unit 300 connected to the substrate 100. Preferably, the substrate 100 is a DBC (Direct Bonded Copper) substrate mounted with a power semiconductor device 150 and formed with a pattern. The power semiconductor device 150 may include, for example, a thyristor (SCR, TRIAC) as an AC device, and CMOS FET, and IGBT as DC devices.

The DBC substrate is a substrate of direct copper bonding method for use in high voltage application, where, for example, a heat radiating copper plate free from a base plate is directly bonded to a power semiconductor device. A power semiconductor module plays an important role in electric industries for conversion and changeover. The now emerging markets for power semiconductor modules may include alternative energy industries and hybrid automobile industries that require a high cooling efficiency, a high current density and a high reliability.

Meanwhile, an integrated terminal unit 300 is manufactured in such a manner that power terminals 210, 220, 230 and signal terminals 311, 311', 312, 312', 313, 313', 314, 314' are integrally assembled with a body 390. The power terminals 210, 20-20, 230 are terminals applying power to the substrate 100 and a power semiconductor device 150 bonded to the substrate 100, and the signal terminals 311, 311', 312, 312', 313, 313', 314, 314' are terminals inputting a control signal to and outputting the control signal from elements assembled to the substrate 100 and a pattern. The body 390 is made of insulated resin material and forms a backbone of the integrated terminal unit 300.

In the present disclosure unlike the conventional power semiconductor module, the power terminals 210, 220, 230 and the signal terminals 311, 311', 312, 312', 313, 313', 314, 314' are not separately mounted to the substrate 100 but connected to the substrate 100 using a unitary work that mounts the integrated terminal unit 300 to the substrate 100 in which the power terminals 210, 220, 230 and the signal terminals 311, 311', 312, 312', 313, 313', 314, 314' are connected to the substrate 100, whereby the number of assembly processes can be decreased, a manufacturing yield can be increased and a potential cause of generating defects can be obviated.

In some exemplary embodiment of the present disclosure, the integrated terminal unit 300 may be formed in such a manner that the power terminals 210, 220, 230 and the signal terminals 311, 311', 312, 312', 313, 313', 314, 314' are mounted to the body by way of injection molding and simultaneously formed by insert injection molding at a time. The exemplary embodiment is well illustrated in FIG. 2.

Preferably, the body 390 is an insulated layer made of insulated resin material and is interposed among several signal terminals 311, 311', 312, 312', 313, 313', 314, 314', and between the power terminals 210, 220, 230 and the signal terminals 311, 311', 312, 312', 313, 313', 314, 314'.

The power terminals 210, 220, 230 are composed of a first power terminal 210, a second power terminal 220 and a third power terminal 230 in a case a three phase power (R phase, S phase, T phase or U phase, V phase, W phase) is applied. The integrated terminal unit 300 is integrated at least with any one power terminal of the three power terminals. FIG. 2 illustrates an integrated terminal unit that is integrally formed with the third power terminal 230.

Meanwhile, another method is that only the signal terminals 311, 311', 312, 312', 313, 313', 314, 314' are insert injection molded with the body 390 while the power terminal 230 is press-fitted into an insertion unit 392 formed at the body 390 to form the integrated terminal unit 300. The exemplary embodiment is well illustrated in FIG. 3.

The several signal terminals 311, 311', 312, 312', 313, 313', 314, 314' and the body 390 are simultaneously formed by way of a unitary injection mold according to insert injection molding method, and the insertion unit 392 formed at the body 390 is inserted by part of the power terminal 230 to form the integrated terminal unit 300.

In some exemplary embodiment of the present invention, the power terminals 210, 220, 230 may include mounting units 212, 222, 232 mounted on the substrate 100, a limiting unit 234 limiting an assembly position relative to the body 390, a terminal connector 238 connected by the power using a bolt fastened to the outside, and a bent unit 236 bending the terminal connector 238 at a predetermined angle relative to the limiting unit 234 to facilitate the bolt fastening for power connection.

As a result, the power terminals 210, 220, 230 are prevented from being dislodged from the body 390 after being assembled to the integrated terminal unit 300, while maintaining a precise mounted height and a precise mounted position relative to the substrate 100 and restraining a contact defect when electrically connected to the outside.

Unlike the conventional power semiconductor module, the integrated terminal unit 300 according to the present disclosure is not connected by a wire, but the power terminals 210, 220, 230 and the signal terminals 311, 311', 312, 312', 313, 313', 314, 314' are simultaneously and directly connected, such that, even if a high heat is generated on the substrate 100 and the power semiconductor device mounted to the substrate 100, a contact defect caused by thermal deformation can be restrained, productivity and reliability can be enhanced and a potential cause for generating defects can be prevented in advance.

As apparent from the foregoing, there are several advantages in the power semiconductor module according to the exemplary embodiments of the present invention in that at least one of power terminals and signal terminals is integrally formed with a body of insulated resin material by way of same injection molding, such that the power semiconductor module is structurally simplified, the number of manufacturing processes is reduced and assembly defects can be greatly decreased.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

What is claimed is:

1. A power semiconductor module comprising:
   a substrate mounted with a power semiconductor device and formed with a pattern; and
   an integrated terminal unit formed with a body which is integrally assembled with a power terminal and a signal terminal, the body being made of an insulated resin material,
   wherein the power terminal applies power to the substrate and the signal terminal inputs a signal to or outputs the signal from the substrate,
   wherein the integrated terminal unit is mounted to the substrate to allow the power terminal and the signal terminal to be simultaneously connected to the substrate,
   wherein the substrate is a DBC (Direct Bonded Copper) substrate, and
   wherein the power terminal includes a mounting unit mounted on the substrate, a limiting unit limiting a position relative to the body, a terminal connector for an external electrical connection, and a bent unit for bending the terminal connector.

2. The power semiconductor module of claim 1, wherein the power terminal and the signal terminal are insert injection molded from the same injection mold with the body.

3. The power semiconductor module of claim 2, wherein:
a plurality of power terminals and signal terminals are provided; and
the body made of the insulated resin material is interposed between the signal terminals and between the power terminals and the signal terminals.

4. The power semiconductor module of claim 1, wherein:
the signal terminal is insert injection molded from the same injection mold with the body; and
the power terminal is press-fitted into an insertion unit formed at the body to form the integrated terminal unit.

5. The power semiconductor module of claim 1, wherein:
the power terminal applies 3-phase power to the substrate by being formed with a first power terminal, a second power terminal and a third power terminal; and
any of the first power terminal, the second power terminal or the third power terminal is integrally provided with the integrated terminal unit.

6. A power semiconductor module comprising:
a substrate mounted with a power semiconductor device and formed with a pattern; and
an integrated terminal unit including a body integrally assembled with a plurality of power terminals for applying power to the substrate and a plurality of signal terminals for applying a signal to or outputting the signal from the substrate, the body being made of an insulated resin material,
wherein an electrical connection between the plurality of power terminals and the substrate and an electrical connection between the plurality of signal terminals and the substrate can be simultaneously executed,
wherein the substrate is a DBC (Direct Bonded Copper) substrate, and
wherein the power terminal includes a mounting unit mounted on the substrate, a limiting unit limiting a position relative to the body, a terminal connector for an external electrical connection, and a bent unit for bending the terminal connector.

7. A power semiconductor module comprising:
a substrate mounted with a power semiconductor device and formed with a pattern; and
an integrated terminal unit including a body assembled with a plurality of power terminals for applying power to the substrate and a plurality of signal terminals for applying a signal to or outputting the signal from the substrate, the body being made of an insulated resin material,
wherein the power terminals, the signal terminals and the substrate are discrete from the body such that the power terminals, the signal terminals and the substrate are electrically isolated,
wherein the substrate is a DBC (Direct Bonded Copper) substrate, and
wherein the power terminal includes a mounting unit mounted on the substrate, a limiting unit limiting a position relative to the body, a terminal connector for an external electrical connection, and a bent unit for bending the terminal connector.

* * * * *